(12) United States Patent
Sadaka et al.

(10) Patent No.: US 7,811,382 B2
(45) Date of Patent: Oct. 12, 2010

(54) METHOD FOR FORMING A SEMICONDUCTOR STRUCTURE HAVING A STRAINED SILICON LAYER

(75) Inventors: Mariam G. Sadaka, Austin, TX (US); Alexander L. Barr, Crolles (FR); Bich-Yen Nguyen, Austin, TX (US); Voon-Yew Thean, Austin, TX (US); Ted R. White, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 929 days.

(21) Appl. No.: 11/421,009

(22) Filed: May 30, 2006

(65) Prior Publication Data

US 2007/0277728 A1 Dec. 6, 2007

(51) Int. Cl.
*C30B 21/02* (2006.01)
(52) U.S. Cl. .............................. 117/84; 117/89; 117/93; 117/98; 117/101
(58) Field of Classification Search ................... 117/84, 117/89, 93, 95, 101
See application file for complete search history.

(56) References Cited

U.S. PATENT DOCUMENTS

| 6,831,292 | B2 | 12/2004 | Currie et al. | |
| 6,881,632 | B2 | 4/2005 | Fitzgerald et al. | |
| 7,202,142 | B2 * | 4/2007 | Lee et al. | 438/481 |
| 2004/0140479 | A1 | 7/2004 | Akatsu | |

OTHER PUBLICATIONS

Lauer, Isaac et al.; "Fully Depleted n-MOSFETs on Supercritical Thickness Strained SOI"; IEEE Electron Device Letters; Feb. 2004; pp. 83-85; vol. 25, No. 2; IEEE.
Thean, A.V.Y. et al; "Performance of Super-Critical Strained-Si Directly On Insulator (SC-SSOI) CMOS Based on 90-nm Process Technology"; VLSI Technology Symposium; Jun. 2005.

* cited by examiner

*Primary Examiner*—Robert M Kunemund
(74) *Attorney, Agent, or Firm*—Joanna G. Chiu; James L. Clingan, Jr.

(57) ABSTRACT

A wafer having a silicon layer that is strained is used to form transistors. The silicon layer is formed by first forming a silicon germanium (SiGe) layer of at least 30 percent germanium that has relaxed strain on a donor wafer. A thin silicon layer is epitaxially grown to have tensile strain on the relaxed SiGe layer. The amount tensile strain is related to the germanium concentration. A high temperature oxide (HTO) layer is formed on the thin silicon layer by reacting dichlorosilane and nitrous oxide at a temperature of preferably between 800 and 850 degrees Celsius. A handle wafer is provided with a supporting substrate and an oxide layer that is then bonded to the HTO layer. The HTO layer, being high density, is able to hold the tensile strain of the thin silicon layer. The relaxed SiGe layer is cleaved then etched away to expose the thin silicon layer. A low temperature silicon layer is then epitaxially grown with tensile strain, correlated to the tensile strain of the thin silicon layer, on the thin silicon layer using trisilane at a temperature preferably not in excess of 500 degrees Celsius. The resulting tensile strain, correlated to the strain of the thin silicon layer, is thus also correlated to the germanium concentration of the relaxed SiGe layer. The thickness of the low temperature silicon layer, using the trisilane at low temperature, is significantly greater than what would normally be expected for a silicon layer of that tensile strain.

15 Claims, 3 Drawing Sheets

METHOD FOR FORMING A SEMICONDUCTOR STRUCTURE HAVING A STRAINED SILICON LAYER

FIELD OF THE INVENTION

The present invention relates generally to semiconductor processing, and more specifically, to forming a strained silicon layer.

RELATED ART

In semiconductor processing, strained semiconductor layers are used to form improved semiconductor devices. For example, compressive strained silicon germanium layers may be used to form improved p-channel devices where the strained silicon germanium allows for improved hole mobility. Similarly, tensile strained silicon layers may be used to form improved n-channel devices where the strained silicon allows for improved electron mobility.

In the case of strained silicon, one method used today for forming strained silicon includes forming a bilayer of strained silicon over silicon germanium. For example, this method includes providing a relaxed silicon germanium layer (which may be part of a bulk silicon germanium wafer or a silicon germanium layer formed over an insulator layer as part of a semiconductor-on-insulator wafer). A silicon layer is then formed on the silicon germanium layer, which, due to the mismatch in lattice constants between the silicon germanium layer and the silicon layer, results in a strained silicon layer. Devices are then formed in these layers. However, the use of this bilayer method introduces dopant diffusion issues related to the formation of shallow source/drain extension and source/drain regions which extend through the silicon layer into the silicon germanium layer. In addition, extended defects typically form along the heterointerface of the Si/SiGe bilayer during subsequent thermal processing which can cause electrical failures especially in short-channel devices. Furthermore, using silicon germanium as the body may cause problems due to self-heating issues of silicon germanium, which may degrade device performance. Therefore, although the strained silicon may improve carrier mobility for the devices, other problems may be introduced. Therefore, a need exists for an improved method for forming a strained silicon layer.

BRIEF DESCRIPTION OF THE DRAWINGS

The present invention is illustrated by way of example and not limited by the accompanying figures, in which like references indicate similar elements, and in which.

Figure 1:
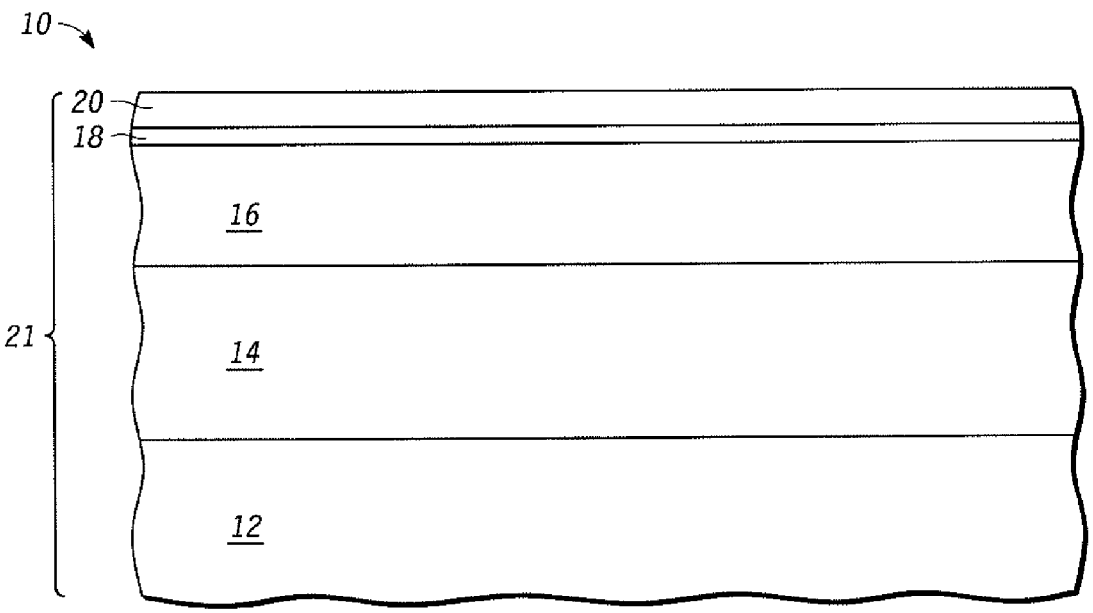
FIGS. 1 and 2 illustrate, in a cross-sectional views, a donor wafer at various processing steps in accordance with one embodiment of the present invention.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

As discussed above, the use of a bilayer method to obtain a strained silicon layer may result in problems. Therefore, one currently known technique forms a strained silicon layer directly on an insulator layer. In this manner, devices can be formed in a uniform material rather than in a bilayer and there is no interface between semiconductor layers to cause problems. One prior art method forms a strained silicon layer on a relaxed silicon germanium layer on a donor wafer and performs a layer transfer to transfer the strained silicon layer to a handle wafer such that, after exfoliation (i.e. the separation or cleaving of the handle wafer from the donor wafer), the handle wafer includes a dielectric layer with the strained silicon layer directly on the dielectric layer. In this prior art method, after exfoliation, the surface of the handle wafer is prepared (which includes removing any excess silicon germanium remaining after exfoliation). Furthermore, in this prior art method, the strain silicon layer may be epitaxially thickened. However, the strain and thickness of the strained silicon layer has to be balanced and limited in order to prevent defects. For example, as will be described below, as the strain of the strained silicon layer formed on the donor wafer is increased, the achievable thickness without dislocations of the strained silicon layer on the handle wafer decreases. Therefore, it may not be possible to achieve both the desired thickness and desired strain together.

In this layer transfer prior art method, after exfoliation, the strained silicon layer is epitaxially thickened using a silane precursor. This has to be performed at a high temperature (of at least 650 degrees Celsius) in order to achieve a sufficient quality epitaxial growth. Also, the silane cannot be performed at a lower temperature because the growth rate would be too low. However, due to the high temperature of at least 650 degrees Celsius, the critical thickness for the strained silicon layer on the handle wafer is limited, where the critical thickness refers to the maximum thickness achievable without losing strain through the formation of defects like dislocations. Therefore, as the temperature used in epitaxially thickening the strained silicon layer increases, the critical thickness decreases.

Furthermore, the problems introduced by the high temperature epitaxial growth is exacerbated as the strain of the silicon layer is increased. That is, the greater the strain, the better the device performance. However, as the strain is increased, the critical thickness is further decreased. Thicker strained layers, though, are needed in order to form high performance and high quality partially depleted devices, which are compatible with current technologies and provide ease of integration (such as by not requiring major changes at the circuit level). The strain in the epitaxially thickened silicon layer is controlled by the germanium concentration in the relaxed silicon germanium layer underlying the strained silicon layer prior to the layer transfer. That is, the greater the germanium concentration in the relaxed silicon germanium layer, the greater the strain in the subsequently formed strained silicon layer and epitaxially thickened silicon layer. The prior art method uses a 20-25% germanium concentration. If the germanium concentration is increased beyond 25%, the critical thickness of the epitaxially grown silicon layer after the layer transfer is overly limited due to the high temperature epitaxial growth, thus not allowing for thicknesses to reach or exceed 300 Angstroms. Therefore, the prior art is unable to achieve a thickness of at least 300 Angstroms, without dislocations, while being able to maintain the stress introduced by over 25% germanium content.

FIG. 1 illustrates a semiconductor structure 10 having a donor wafer 21 in accordance with one embodiment of the present invention. Donor wafer 21 includes a silicon layer 12, a graded silicon germanium (SiGe) layer 14 over silicon substrate 12, and a SiGe buffer layer 16 over graded SiGe layer 14. Silicon layer 12 has a relaxed strain. Graded SiGe is graded from silicon layer 12 at about a 0% germanium concentration up to a desired germanium concentration over a particular thickness. For example, in one embodiment, graded SiGe layer 14 is graded from about 0% germanium concentration to at least about 30% germanium concentration, where it may be graded, for example, at about 10% per micron. SiGe buffer layer 16 has a relaxed strain and a germanium concentration of the desired final germanium concentration of graded SiGe layer 14. For example, SiGe buffer layer 16 may have a germanium concentration of at least about 30%, or, alternatively, at least about 40%. In one embodiment, SiGe buffer layer 16 has a thickness of at least about 1 micron, or, more preferably, at least about 2 microns.

Donor wafer 21 also includes an epitaxially grown strained silicon layer 18 over SiGe buffer layer 16 which has a tensile strain due to the mismatch of lattice constants between the silicon of silicon layer 18 and the SiGe of SiGe buffer layer 16. Therefore, note that the germanium concentration of SiGe buffer layer 16 controls the amount of tensile strain in strained silicon layer 18. Also, in one embodiment, strained silicon layer 18 has a thickness of at most about 200 Angstroms.

Donor wafer 21 also includes a dielectric layer 20 over strained silicon layer 18. In one embodiment, dielectric layer 20 is an oxide layer formed by high temperature oxide (HTO). HTO is a deposition which, in one embodiment, is performed at a temperature of at least about 750 degrees Celsius, or, more preferably, at least about 800 degrees Celsius, using dichlorosilene and nitrous oxide ($N_2O$) as precursors. In one embodiment, HTO is performed at a temperature between about 800 and 850 degrees Celsius.

Figure 2:
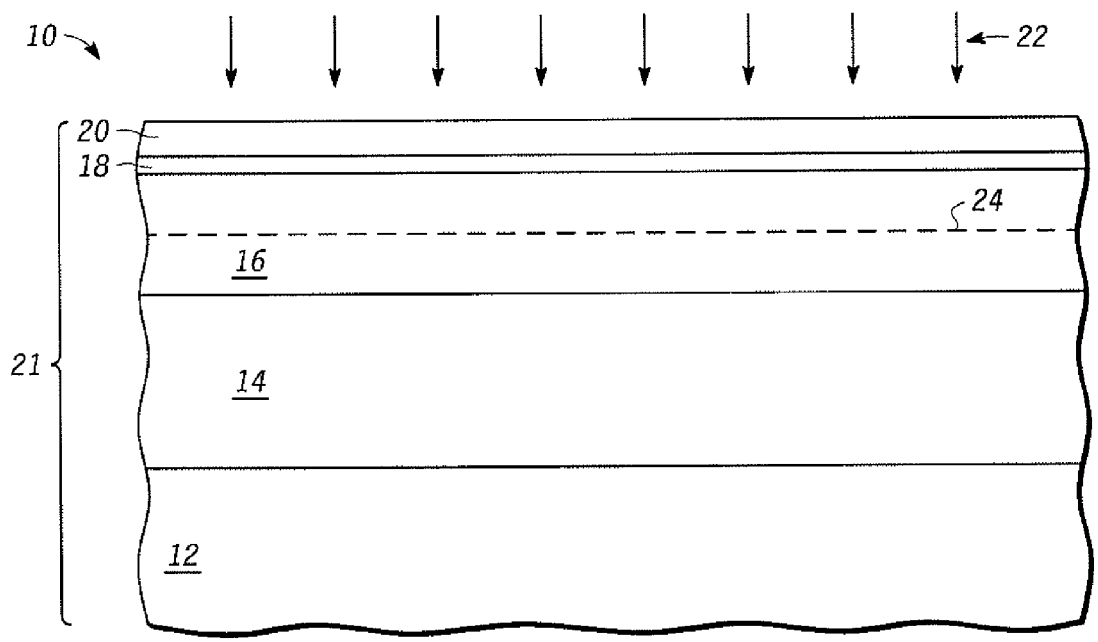

FIG. 2 illustrates donor wafer 21 receiving an implant 22 in order to form a cleave line 24 in SiGe buffer layer 16. In one embodiment, implant 22 includes a hydrogen implant or a helium implant. The hydrogen or helium forms a defect layer which corresponds to cleave line 24, such that a separation can occur at cleave line 24. The dose and energy of implant 22 can be controlled, as known in the art, in order to control the location of cleave line 24.

Figure 3:
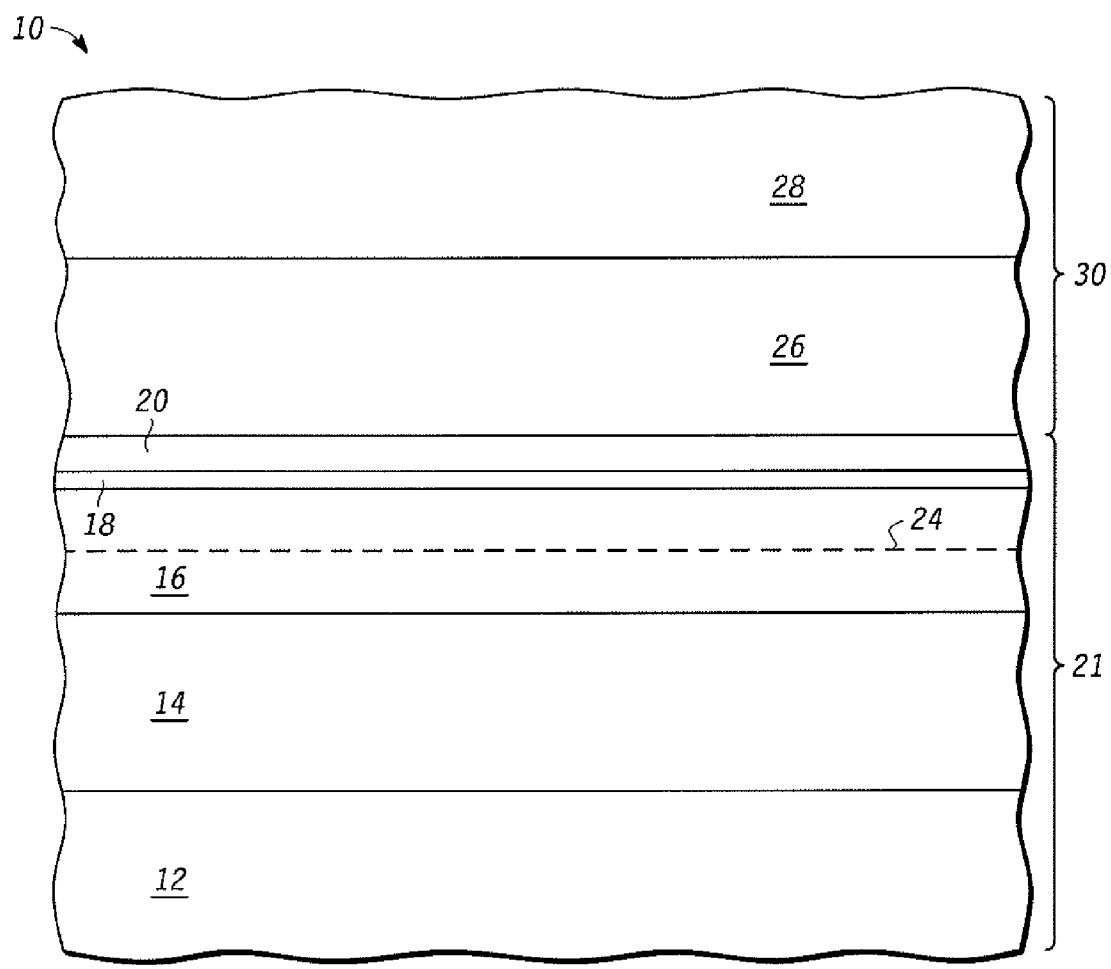
FIG. 3 illustrates, in a cross-sectional view, a handle wafer bonded to the donor wafer in accordance with one embodiment of the present invention.

FIG. 3 illustrates donor wafer 21 after bonding with a handle wafer 30. Handle wafer 30 includes a mechanical substrate 28 (also referred to as a supporting substrate) and a dielectric layer 26 over mechanical substrate 28. In one embodiment, dielectric layer 26 is an oxide layer and may therefore be referred to as a buried oxide (BOX). During the bonding process, dielectric layer 26 is brought into contact and chemically bonded with dielectric layer 20 of donor wafer 21.

Figure 4:
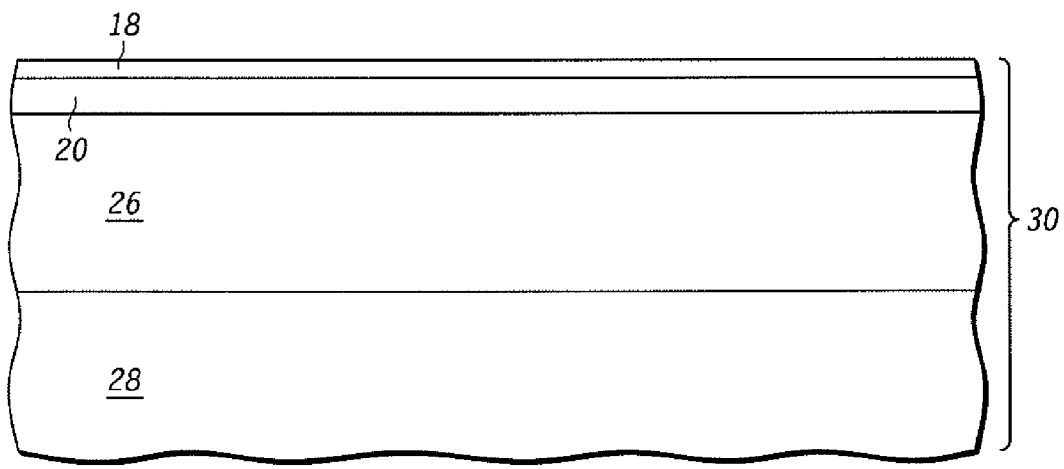
FIGS. 4-6 illustrate, in cross-sectional views, the handle wafer of FIG. 3 at various processing steps in accordance with embodiments of the present invention.

FIG. 4 illustrates handle wafer 30 after exfoliation or cleaving (i.e. separation from donor wafer 21). As described above, implant 22 creates a defect layer which forms cleave line 24. For example, in one embodiment, the cleave line 24 includes bubbles and fissures caused by implant 22. Cleaving may include applying a mechanical force to separate donor wafer 21 and handle wafer 30 along cleave line 24 due to the defects along cleave line 24. Note that after exfoliation, a portion of SiGe buffer layer 16 remains on handle wafer 30. Therefore, after exfoliation, surface preparation of handle wafer 30 may be performed where this may include removing the remaining portion of SiGe layer 16 to expose strained silicon layer 18. This may be performed using a selective etch process, as known in the art. Therefore, a layer transfer of strained silicon layer 18 (also referred to as a thin silicon layer) has been performed from donor wafer 21 to handle wafer 30 where the strain of strained silicon layer 18 on handle wafer 30 correlates to the germanium concentration of SiGe buffer layer 16 on donor wafer 21.

Figure 5:
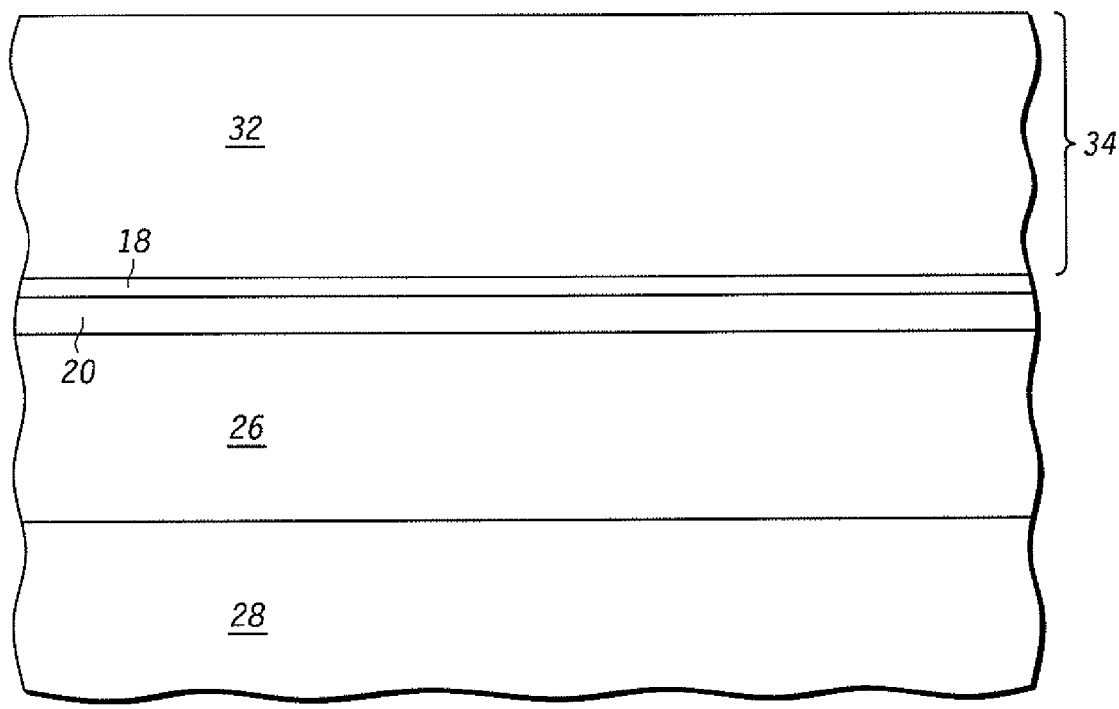

FIG. 5 illustrates handle wafer 30 after epitaxially growing silicon on strained silicon layer 18 at a low temperature to form a low temperature silicon layer 32. The strain of low temperature silicon layer 32 therefore correlates to the strain of strained silicon layer 18 (and thus to the germanium concentration of SiGe buffer layer 16). In one embodiment, this epitaxial growth is performed by applying a trisilane precursor at a temperature of less than about 650 degrees Celsius. In one embodiment, the epitaxial growth is performed at a temperature of not greater than about 500 degrees Celsius, or, alternatively, not greater than about 400 degrees Celsius. In one embodiment, either hydrogen or helium is applied with the trisilane to form low temperature silicon layer 32. In one embodiment, low temperature silicon layer 32 is grown to a thickness of at least about 300 Angstroms. Furthermore, since the use of the trisilane precursor allows for the use of a low temperature epitaxial deposition to form low temperature silicon layer 32, the strain of strained silicon layer 18 is maintained throughout the thickness of low temperature silicon layer 32 without dislocations. In one embodiment, the biaxial tensile strain of strained silicon layer 18 that is maintained throughout the thickness of low temperature silicon layer 32 is at least about 1.2% (which correlates to the at least about 30% germanium concentration in SiGe buffer layer 16). Note that the prior art method described above cannot achieve a strain of at least about 1.2% while allowing for a sufficient thickness of at least about 300 Angstroms.

In alternate embodiments, even thicker strained silicon layers may be needed. For example, low temperature silicon layer 32 may have a thickness of at least about 500 Angstroms or at least about 1000 Angstroms. Also, in one embodiment, low temperature silicon layer 32 may be grown to a thickness of at least three times thicker than strained silicon layer 18. With the prior art method described above, if these thicknesses are desired (of, e.g., greater than 300 Angstroms, 500 Angstroms, 1000 Angstroms, or 3 times the thickness of strained silicon layer 18), then a lower strain silicon layer has to be used in order to prevent dislocations during the epitaxial thickening of the strained silicon layer using silane. That is, in forming these thicknesses using the prior art method, the concentration of germanium in the silicon germanium layer cannot exceed 25%. Therefore, the use of trisilane at a low temperature of at most 650 degrees Celsius to form low temperature silicon layer 32 allows for both the higher concentration of germanium in SiGe buffer layer 16 (at least about 30% or at least about 40%) and the greater thickness of low temperature silicon layer 32 (e.g. in excess of about 300 Angstroms) than what would normally be expected. For example, low temperature silicon layer 32 can be grown to a thickness of greater than 500 Angstroms at a temperature of not greater than 500 degrees Celsius.

Also, in the prior art method discussed above, a tetraethylorthosilicate (TEOS) deposited oxide is used the dielectric layer formed over the relaxed silicon germanium layer prior to formation of the cleave line. However, since TEOS deposited oxide is deposited at a lower temperature, it is less dense as compared to HTO oxide. Since TEOS oxide is less dense, it is more susceptible to change during the thickening process used to epitaxially thicken the strained silicon layer. Therefore, the HTO oxide is better able to support the higher strain of low temperature semiconductor layer 32 as compared to the prior art method.

Figure 6:
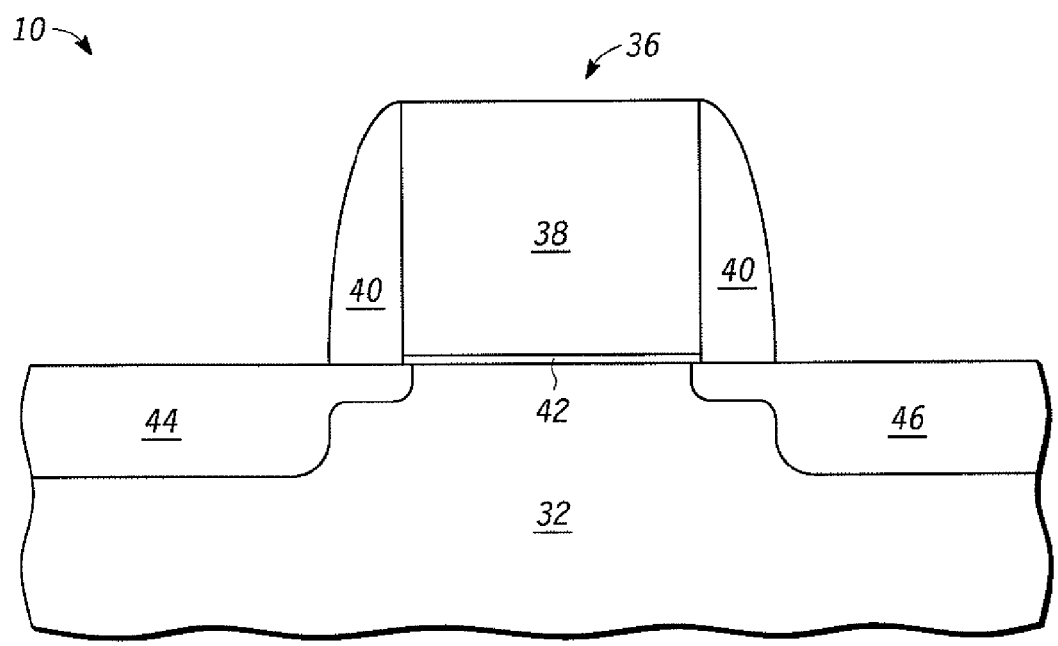

FIG. 6 illustrates handle wafer 30 after formation of a transistor 36 in and on low temperature silicon layer 32. Transistor 36 includes gate dielectric 42 over low temperature silicon layer 32, a gate 38 over gate dielectric 42, sidewall spacers adjacent gate 38, and source/drain regions 44 and 46 in strained silicon layer 32 under spacers 40 and under at least a portion of gate dielectric 42. Note that gate 38 is over a space between source/drain regions 44 and 46. In the illustrated embodiment, transistor 36 is a partially depleted n-channel device formed in low temperature strained silicon layer 32. The strain of layer 32 allows for improved performance of transistor 36, and the ability to achieve a greater thickness for layer 32 allows for improved performance and the ability to be partially depleted. Furthermore, transistor 36 avoids the bilayer problems. For example, note that source/drain regions 44 and 46 do not extend across a layer boundary.

Note that transistor 36 is just an example of a semiconductor device that can be formed in and on layer 32, and may be formed using known processes. Also, gate 38 can be any type of gate electrode, and each of gate dielectric 42, gate 38, and spacers 40 can include any number and type of appropriate materials. Also, source/drain regions can be formed using known methods.

Although the above embodiments have been described as applicable to the formation of n-channel transistors, such as transistor 36, any device requiring a thicker body may benefit from the formation of low temperature silicon layer 32.

Although the above descriptions were provided with respect to forming relaxed SiGe and a strained Si on the relaxed SiGe, other materials may be used to form other types of strained semiconductor materials directly on a dielectric, such as dielectric 26 of handle wafer 30. For example, strained SiGe can be formed directly on silicon layer 12 of donor wafer 21 where the layer transfer would transfer the strained SiGe to handle wafer 30. The strained SiGe could then be epitaxially thickened. Also, rather than strained SiGe in this example, strained SiC or strained Ge can be formed. In another alternate embodiment, strained Ge can be formed on the graded SiGe layer, where the strained Ge is transferred to the handle wafer.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A method for making a semiconductor structure, comprising:
   providing a donor wafer comprising:
      a silicon layer that has relaxed strain;
      a graded silicon germanium (SiGe) layer on the silicon layer; and
      a SiGe buffer layer on the graded SiGe layer, wherein the SiGe buffer layer has relaxed strain and has a germanium concentration of at least 30 percent;
   epitaxially growing a first silicon layer on the SiGe buffer layer to a thickness of less than 200 Angstroms, wherein the first silicon layer has tensile strain;
   forming a first dielectric layer on the first silicon layer;
   performing an implant to form a cleave line in the SiGe buffer layer;
   providing a handle wafer comprising:
      a semiconductor substrate; and
      second dielectric layer on the semiconductor substrate;
   bonding the second dielectric layer to the first dielectric layer;
   cleaving the SiGe buffer layer along the cleave line to leave the first dielectric layer, the first silicon layer, and a portion of the SiGe buffer layer attached to the handle wafer;
   removing the portion of the SiGe layer to expose the first silicon layer;
   epitaxially growing silicon on the first silicon layer by applying trisilane at a temperature below 650 degrees Celsius to form a low temperature silicon layer on the first silicon layer to a thickness in excess of 300 Angstroms, wherein the low temperature silicon layer has tensile strain; and
   forming a transistor having a gate over the low temperature silicon layer, a first source/drain in the low temperature silicon layer, and a second source/drain in the low temperature in the low temperature silicon layer, wherein the gate is over a space between the first and second source/drains.

2. The method of claim 1, wherein the step of epitaxially growing silicon forms the low temperature silicon layer to a thickness of at least three times thicker than the first silicon layer and with biaxial tensile strain.

3. The method of claim 1, wherein the step of epitaxially growing silicon further comprises applying hydrogen with the trisilane.

4. The method of claim 1, wherein the step of epitaxially growing silicon further comprises applying helium with the trisilane.

5. The method of claim 1, wherein the step of epitaxially growing silicon forms the low temperature silicon layer to a thickness in excess of 500 Angstroms.

6. The method of claim 5, wherein the step of epitaxially growing silicon forms the low temperature silicon layer to a thickness of about 1000 Angstroms.

7. The method of claim 1, wherein the forming the first dielectric layer comprises forming the first dielectric layer of high temperature oxide formed from dichlorosilane and nitrous oxide at a temperature of at least 750 degrees Celsius.

8. The method of claim 1, wherein the forming the first dielectric layer comprises forming the first dielectric layer of high temperature oxide formed from disilane and nitrous oxide at a temperature between about 800 and 850 degrees Celsius.

9. The method of claim 1, wherein the step of epitaxially growing the low temperature silicon layer is performed at a temperature not greater than 500 degrees Celsius.

10. A method of forming a semiconductor structure, comprising:
providing a donor wafer comprising:
a silicon layer;
a graded silicon germanium (SiGE) layer on the silicon layer; and
a SiGe buffer layer on the graded SiGe layer;
epitaxially growing a first silicon layer on the SiGe buffer layer;
forming a first dielectric layer on the first silicon layer;
providing a handle wafer comprising:
a supporting substrate; and
second dielectric layer on the supporting substrate;
bonding the second dielectric layer to the first dielectric layer;
cleaving the SiGe buffer layer to leave the first dielectric layer, the silicon layer, and a portion of the SiGe buffer layer attached to the handle wafer;
removing the portion of the SiGe layer to expose the first silicon layer;
epitaxially growing silicon on the first silicon layer by applying trisilane at a temperature below 650 degrees Celsius to form a low temperature silicon layer on the first silicon layer; and
forming a transistor over and in the low temperature silicon layer;
wherein:
the step of epitaxially growing the first silicon layer grows the first silicon layer to thickness of less than 200 Angstroms; and
the step of epitaxially growing silicon comprises growing the low temperature silicon to a thickness of greater than 500 Angstroms at a temperature of not greater than 500 degrees Celsius.

11. The method of claim 10, wherein
the step of forming the first dielectric comprises reacting dichlorosilane and nitrous oxide at a temperature of at least 750 degrees Celsius.

12. The method of claim 10, wherein:
the step of providing the donor wafer provides the SiGe buffer layer at a germanium concentration not less than 30 percent and the silicon layer at a relaxed strain;
the step of epitaxially growing the first silicon layer grows the first silicon layer to achieve a biaxial tensile strain; and
the step of epitaxially growing silicon comprises growing the low temperature silicon with a biaxial tensile strain.

13. The method of claim 10, wherein the forming the first dielectric layer comprises forming the first dielectric layer of high temperature oxide formed from dichorosilane and nitrous oxide at a temperature between about 800 and 850 degrees Celsius.

14. A method of forming a semiconductor structure, comprising:
providing a donor wafer comprising a silicon germanium (SiGe) buffer layer having relaxed strain;
epitaxially growing a first silicon layer on the SiGe buffer layer;
forming a first dielectric layer on the first silicon layer by applying disilane and nitrous oxide at a temperature of at least 750 degrees Celsius;
providing a handle wafer comprising:
a supporting substrate; and
an oxide layer on the supporting substrate;
bonding the first dielectric layer to the oxide layer;
cleaving the SiGe buffer layer to leave the first dielectric layer, the first silicon layer, and a portion of the SiGe buffer layer attached to the handle wafer;
removing the portion of the SiGe buffer layer to expose the first silicon layer;
epitaxially growing silicon on the first silicon layer to form a second silicon layer on the first silicon layer; and
forming a transistor in and over the second silicon layer;
wherein:
the step of providing the donor wafer provides the SiGe buffer layer at a germanium concentration not less than 30 percent;
the step of epitaxially growing the first silicon layer grows the first silicon layer to a thickness of less than 200 Angstroms with a biaxial tensile strain; and
the step of epitaxially growing silicon comprises growing the second silicon layer to a thickness of greater than 500 Angstroms at a temperature of not greater than 500 degrees Celsius with a biaxial tensile strain.

15. The method of claim 14, wherein the forming the first dielectric layer occurs at a temperature between about 800 and 850 degrees Celsius.

* * * * *